United States Patent
Chao et al.

(10) Patent No.: US 10,355,103 B2
(45) Date of Patent: *Jul. 16, 2019

(54) LONG CHANNELS FOR TRANSISTORS

(71) Applicant: INTERNATIONAL BUSINESS MACHINES CORPORATION, Armonk, NY (US)

(72) Inventors: Robin Hsin Kuo Chao, Cohoes, NY (US); Choonghyun Lee, Rensselaer, NY (US); Heng Wu, Guilderland, NY (US); Chun Wing Yeung, Niskayuna, NY (US); Jingyun Zhang, Albany, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/844,950

(22) Filed: Dec. 18, 2017

(65) Prior Publication Data

US 2019/0189776 A1    Jun. 20, 2019

(51) Int. Cl.
*H01L 29/66* (2006.01)
*H01L 29/10* (2006.01)
*H01L 21/8234* (2006.01)
*H01L 21/306* (2006.01)
*H01L 29/423* (2006.01)

(52) U.S. Cl.
CPC .. *H01L 29/66598* (2013.01); *H01L 21/30604* (2013.01); *H01L 21/823431* (2013.01); *H01L 29/1037* (2013.01); *H01L 29/42392* (2013.01); *H01L 29/6656* (2013.01); *H01L 29/66545* (2013.01); *H01L 29/66666* (2013.01); *H01L 29/66795* (2013.01)

(58) Field of Classification Search
CPC ......... H01L 2029/7858; H01L 29/0676; H01L 29/42392
See application file for complete search history.

(56) References Cited

U.S. PATENT DOCUMENTS 9,431,388 B1 * 8/2016 Gauthier, Jr. ....... H01L 27/0255
2004/0169269 A1 * 9/2004 Yeo ................... H01L 29/41791
                                                                    257/692

(Continued)

OTHER PUBLICATIONS

List of IBM Patents or Patent Applications Treated as Related; (Appendix P), Filed Dec. 18, 2017; 2 pages.

(Continued)

*Primary Examiner* — Frederick B Hargrove
(74) *Attorney, Agent, or Firm* — Cantor Colburn LLP; Vazken Alexanian

(57) ABSTRACT

A semiconductor device includes a first nanosheet stack, a second nanosheet stack, and a third nanosheet stack arranged on a substrate. The semiconductor device includes a gate arranged on the first nanosheet stack, the second nanosheet stack, and the third nanosheet stack. The semiconductor device includes a channel extending through the gate and from the first nanosheet stack, the second nanosheet stack, and to the third nanosheet stack in a serpentine fashion. The semiconductor device includes a first source/drain and a second source/drain arranged on opposing sides of the gate.

14 Claims, 5 Drawing Sheets

(56) References Cited

U.S. PATENT DOCUMENTS

2013/0161756 A1* 6/2013 Glass ............... H01L 29/66545
 257/369
2014/0159159 A1* 6/2014 Steigerwald ...... H01L 29/66795
 257/369

OTHER PUBLICATIONS

Robin Hsin Kuo Chao, et al., "Long Channels for Transistors", U.S. Appl. No. 15/844,923, filed Dec. 18, 2017.

* cited by examiner

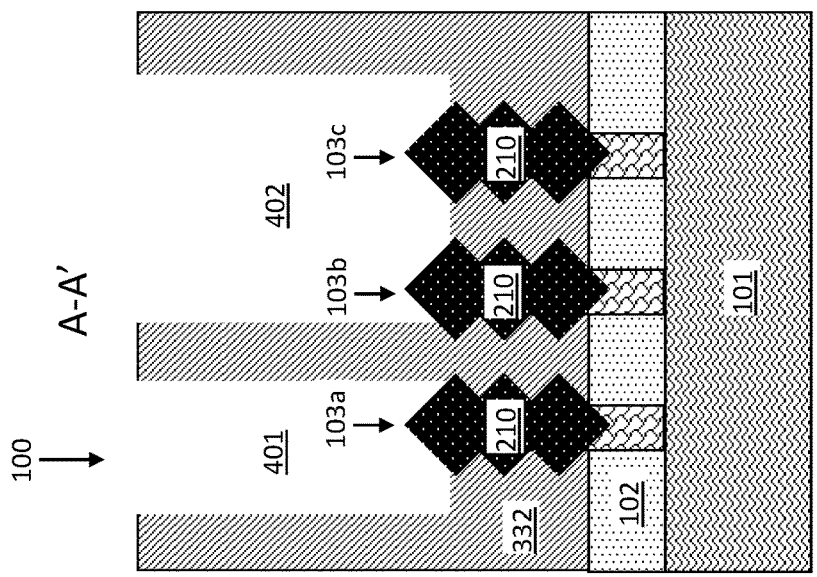
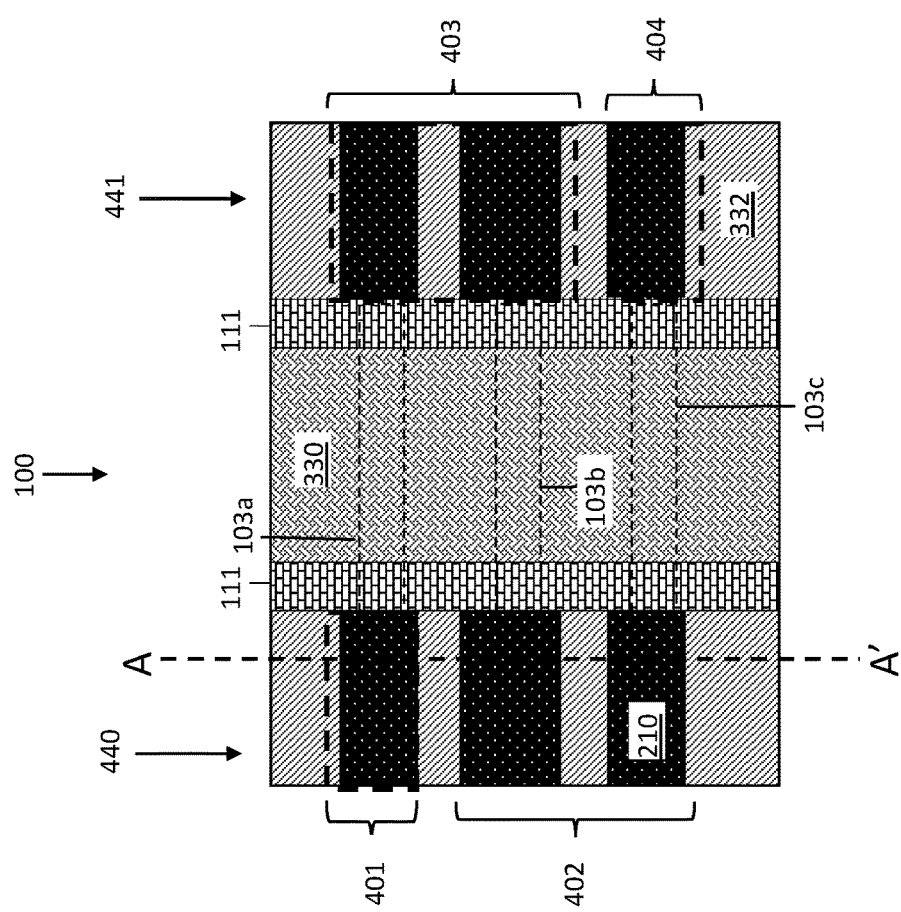
FIG. 4B
FIG. 4A

LONG CHANNELS FOR TRANSISTORS

BACKGROUND

The present invention generally relates to fabrication methods and resulting structures for semiconductor devices. More specifically, the present invention relates to long channels for transistors.

Semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

SUMMARY

Embodiments of the present invention are directed to a method for fabricating a semiconductor device. A non-limiting example of the method includes forming a gate on a first nanosheet stack, a second nanosheet stack, and a third nanosheet stack arranged on a substrate. The method includes depositing a semiconductor material on the first nanosheet stack, the second nanosheet stack, and the third nanosheet stack. The method includes depositing an interlayer dielectric (ILD) on the first nanosheet stack, the second nanosheet stack, and the third nanosheet stack. The method further includes forming a first trench and a second trench through the ILD on a first side of the gate, and a third trench and a fourth trench through the ILD on a second side of the gate. The second trench couples the second nanosheet stack to the third nanosheet stack, and the third trench couples the first nanosheet stack to the second nanosheet stack. The method includes depositing a metal in the first trench, the second trench, the third trench, and the fourth trench.

A non-limiting example of the method for fabricating a semiconductor device includes forming a gate on a first nanosheet stack, a second nanosheet stack, and a third nanosheet stack arranged on a substrate. The first nanosheet stack, the second nanosheet stack, and the third nanosheet stack include alternating layers of silicon and silicon germanium. The method includes depositing a semiconductor material on the layer of silicon of the first nanosheet stack, the second nanosheet stack, and the third nanosheet stack. The method includes depositing an interlayer dielectric (ILD) on the first nanosheet stack, the second nanosheet stack, and the third nanosheet stack. The method includes forming a first trench and a second trench through the ILD on a first side of the gate, and a third trench and a fourth trench through the ILD on a second side of the gate. The second trench couples the second nanosheet stack to the third nanosheet stack, and the third trench couples the first nanosheet stack to the second nanosheet stack. The method further includes depositing a metal in the first trench, the second trench, the third trench, and the fourth trench.

Embodiments of the invention are directed to a semiconductor device. A non-limiting example of the semiconductor device includes a first nanosheet stack, a second nanosheet stack, and a third nanosheet stack arranged on a substrate. The semiconductor device includes a gate arranged on the first nanosheet stack, the second nanosheet stack, and the third nanosheet stack. The semiconductor device includes a channel extending through the gate and from the first nanosheet stack, the second nanosheet stack, and to the third nanosheet stack in a serpentine fashion. The semiconductor device includes a first source/drain and a second source/drain arranged on opposing sides of the gate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-5B depict a method for forming a semiconductor device according to embodiments of the invention, in which:

FIG. 1A depicts a top view of a semiconductor device after forming a dummy gate on nanosheet stacks;

FIG. 4A depicts a top view of a semiconductor device after forming trenches in the ILD;

FIG. 4B depicts a side view of the semiconductor device shown in FIG. 4A;

FIG. 5B depicts a side view of the semiconductor device shown in FIG. 5A;

Figure 1B:
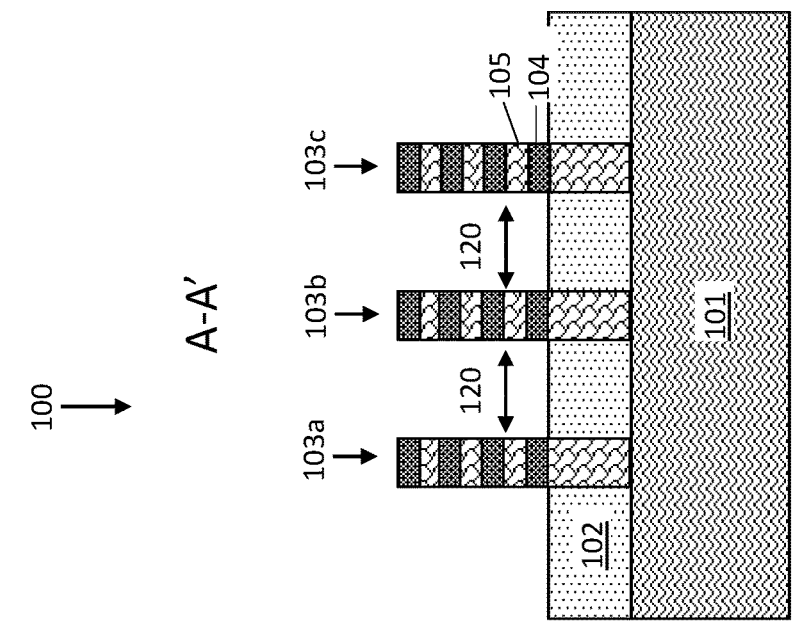
FIG. 1B depicts a side view of the semiconductor device shown in FIG. 1A.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, one particularly advantageous type of MOSFET is known generally as a gate-all-around (GAA) nanosheet FET, which provides a relatively small FET footprint by forming the channel region as a series of nanosheets. In a GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si), and the sacrificial nanosheets are silicon germanium (SiGe). For p-type FETs, the channel nanosheets are SiGe, and the sacrificial nanosheets are Si.

Integrated circuits, particularly input/output (I/O) circuits, need relatively long channels (e.g., greater than 100 nanometers (nm)). Analog circuits used in system on chips (SOCs) or internet of things (IoTs) also use the long channel devices for special design purposes. However, fabrication methods for forming long channel devices adjacent to short channel devices need an extra mask over the long channel device during replacement of the sacrificial dummy gate with the metal gate. The extra mask is needed to balance the gate metal recess budget difference between the long and short channel devices. The cost per area to fabricate conventional long channel devices is therefore large and inefficient.

Turning now to an overview of the aspects of the invention, one or more embodiments of the invention address the above-described shortcomings of the prior art by providing fabrication methods for forming a long channel (greater than 100 nm in length) in a nanosheet device. The long channel is formed by arranging a series of short channels in a serpentine (or zig-zag) arrangement. The channel length is determined by the number of connected short channels, which provides the ability to easily vary the length of the channel.

The above-described aspects of the invention address the shortcomings of the prior art by providing methods to form long channel devices with a short channel compatible process. The methods eliminate the need for an extra mask during replacement of the sacrificial dummy gate with the metal gate. With these methods, the long channel devices have similar processing times as the short channel devices.

Figure 1A:
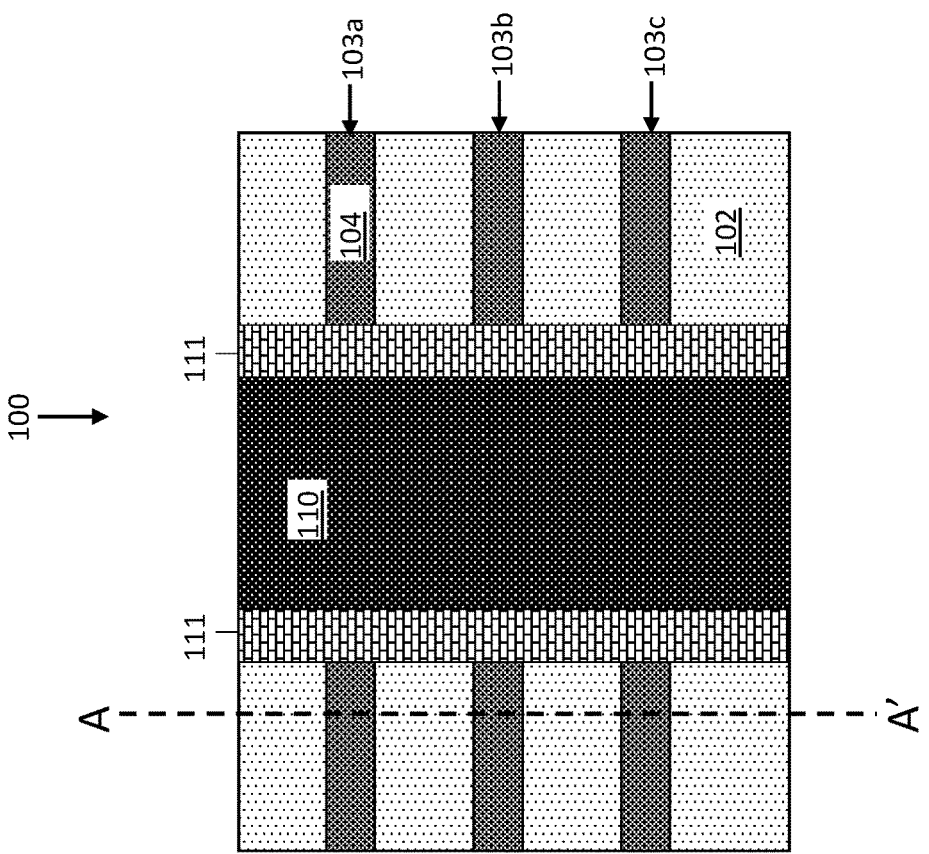

Turning now to a more detailed description of aspects of the present invention, FIGS. 1A-5B depict a method for forming a semiconductor device 100 according to embodiments of the invention. FIG. 1A depicts a top view of a semiconductor device 100 after forming a dummy gate 110 on nanosheet stacks. FIG. 1B depicts a cross-sectional side view through the A-A' axis of the semiconductor device 100 shown in FIG. 1A.

The semiconductor device 100 is a nanosheet FET and includes isolation regions 102 arranged on a semiconductor substrate 101. The isolation regions 102 are for isolation of active areas from one another.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The isolation regions 102 can be formed by any known method in the art, including, for example, lithography or etching to form trenches, and then filling the trenches with an insulating material, such as silicon dioxide. In the exemplary embodiment, the isolation regions 102 are shallow trench isolation regions (STIs). However, the isolation region 102 can be a trench isolation region, a field oxide isolation region (not shown), or any other equivalent known in the art. The isolation regions 102 provide isolation between neighboring gate structure regions and can be used when the neighboring gates have opposite conductivities, i.e., nFETs and pFETs. As such, the at least one isolation region 102 can separate an nFET device region from a pFET device region.

Nanosheet stacks 103a (first nanosheet stack), 103b (second nanosheet stack), and 103c (third nanosheet stack) are arranged on the isolation regions 102 and the substrate 101. Although three nanosheet stacks 103a, 103b, and 103c are shown as an exemplary embodiment, the semiconductor device 100 can include more than three nanosheet stacks in other embodiments. The nanosheet stacks 103a, 103b, 103c can be formed in the substrate 101 by patterning a mask and then etching the substrate 101. The nanosheet stacks 103a, 103b, 103c also can be patterned in the substrate by, for example, sidewall imaging transfer.

The nanosheet stacks 103a, 103b, 103c each include alternating layers of a first nanosheet 104 and a second nanosheet 105. The first nanosheet 104 contacts the isolation region 102. The first nanosheet 104 is a semiconductor material, for example, silicon germanium in some embodiments. Other non-limiting examples of semiconductor materials for the first nanosheet 104 include Si (silicon), strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof.

The second nanosheet 105 alternates with the first nanosheet 104 in the nanosheet stacks 103a, 103b, and 103c. The second nanosheet 105 is a semiconductor material, for example, silicon. Other non-limiting examples of semiconductor materials for the second nanosheet 105 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

Although nanosheet stacks 103a, 103b, 103c include four layers of first nanosheet 104 and three layers of second nanosheet 105, the nanosheet stacks 103a, 103b, 103c can include any number of first nanosheets 104 and second nanosheets 105. The nanosheet stacks 103a, 103b, 103c can include one or more layers of each of first nanosheet 104 and second nanosheet 105. For example, nanosheet stacks 103a, 103b, 103c can include one layer of first nanosheet 104 positioned in contact with the substrate 201 and one layer of second nanosheet 105 disposed on the first nanosheet 105.

First and second nanosheets 301, 232 can be formed on the substrate 201 by for example, forming alternating layers of first and second nanosheets 104, 105 on the substrate 101, patterning the multi-layer stack into fin shaped structures, with the width of the fin structures defining the width of the nanosheets.

The height of the nanosheet stacks 103a, 103b, and 103c generally vary, as it depends on the type of device, and is not intended to be limited. In the exemplary embodiment, the pitch 120 of the nanosheet stacks (between nanosheet stack 103a and 103b, and between 103b and 103c) is at least 30 nm.

The semiconductor device 100 includes a gate 110 arranged on the first nanosheet stack 103a, second nanosheet stack 103b, and third nanosheet stack 103c. The gate 110 is a "dummy gate" and includes a sacrificial gate material (dummy gate material). The sacrificial gate material can be, for example, amorphous silicon or polysilicon.

The gate 110 includes gate spacers 111. The gate spacers 111 include a dielectric material, for example, silicon dioxide, silicon nitride, SiOCN, or SiBCN. Other non-limiting examples of materials for the gates spacers 111 include dielectric oxides, dielectric nitrides, dielectric oxynitrides, or any combination thereof.

Figure 2B:
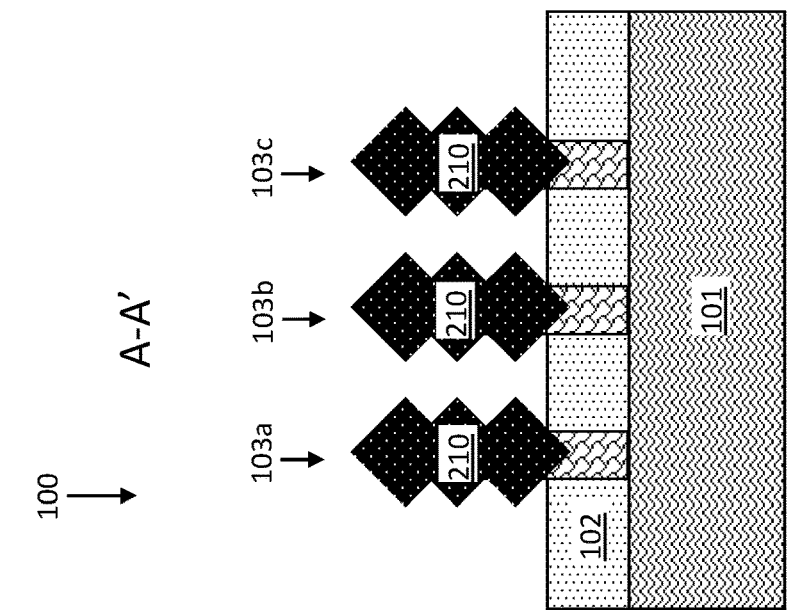
FIG. 2B depicts a side view of the semiconductor device shown in FIG. 2A.
Figure 2A:
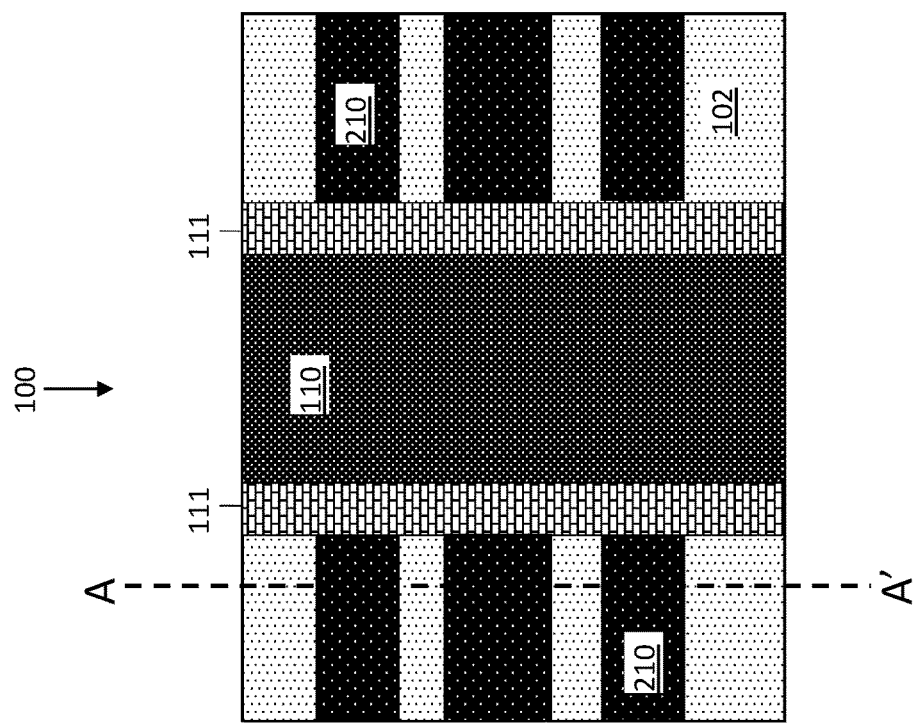
FIG. 2A depicts a top view of a semiconductor device after performing an epitaxial growth process.

FIG. 2A depicts a top view of the semiconductor device 100 after performing an epitaxial growth process. FIG. 2B depicts a cross-sectional side view through the A-A' axis of the semiconductor device 100 shown in FIG. 2A.

The epitaxial growth process deposits epitaxial growth 210 on the semiconductor material of the nanosheet stacks 103a, 103b, and 103c. The epitaxial growth 210 does not overlap on neighboring nanosheet stacks when the pitch 120 (see FIG. 1B) of the nanosheet stacks is large enough. The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). Epitaxial semiconductor materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The first nanosheets 104 in the source/drain regions outside the gate can be selectively removed according to some embodiments after performing the epitaxial growth process. In other embodiments, the first nanosheets 104 are not removed.

Figure 3B:
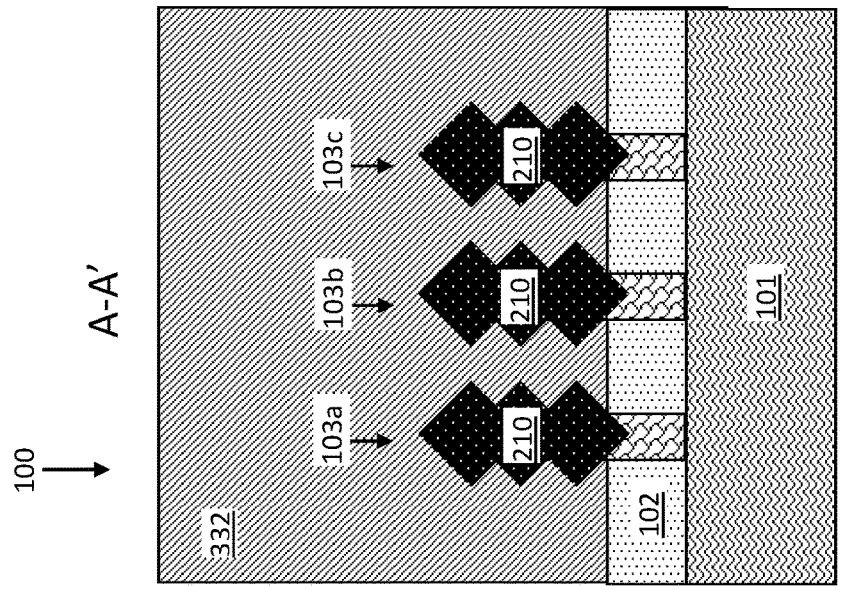
FIG. 3B depicts a side view of the semiconductor device shown in FIG. 3A.
Figure 3A:
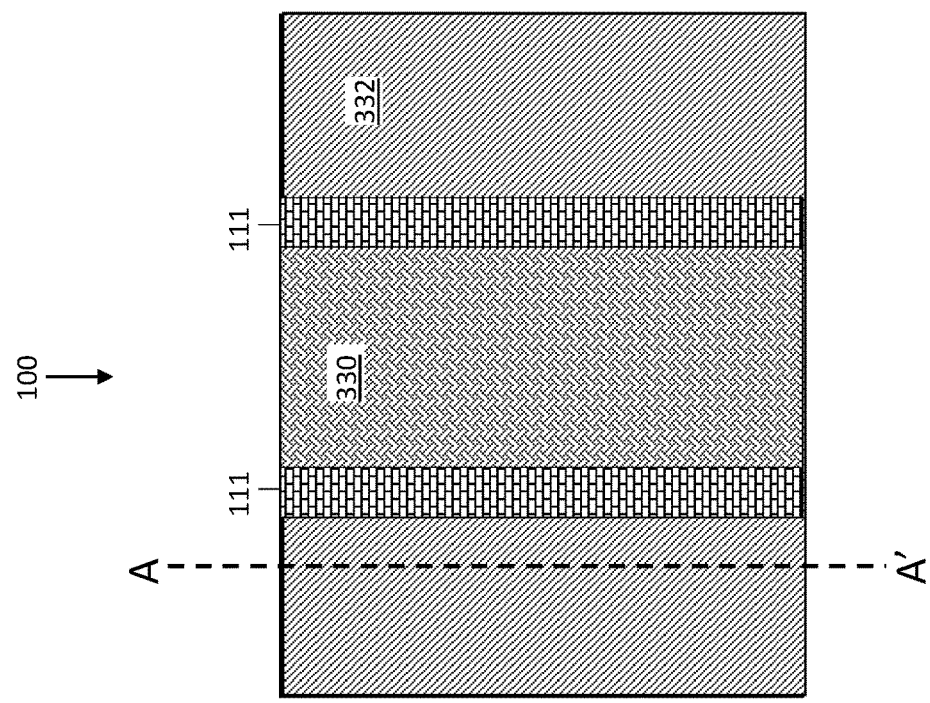
FIG. 3A depicts a top view of a semiconductor device after depositing an interlayer dielectric (ILD) and replacing the dummy gate with a metal gate.

FIG. 3A depicts a top view of a semiconductor device 100 after depositing an interlayer dielectric (ILD) 332 on the nanosheet stacks and replacing the dummy gate 110 with a metal gate 330. FIG. 3B depicts a cross-sectional side view through the A-A' axis of the semiconductor device 100 shown in FIG. 3A.

The ILD 332 is deposited on and around the nanosheet stacks 103a, 103b, and 103c and around the metal gate 330. The ILD 332 can be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 332 can be deposited by a deposition process, including, but not limited to CVD, PVD, plasma enhanced CVD, atomic layer deposition (ALD), evaporation, chemical solution deposition, or like processes.

The metal gate 330 includes metal gates formed, for example, by filling a dummy gate opening (after removing the sacrificial gate material) with one or more dielectric materials, one or more workfunction metals, and one or more metal gate conductor materials. The gate dielectric material(s) can be a dielectric material having a dielectric constant greater than about 3.9, about 7.0, or about 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The work function metal(s) can be disposed over the gate dielectric material. The type of work function metal(s) depends on the type of transistor and can differ between an nFET and a pFET. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive metal is deposited over the dielectric material(s) and workfunction layer(s) to form the metal gates 330. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

FIG. 4A depicts a top view of the semiconductor device 100 after forming trenches in the ILD 332. FIG. 4B depicts a cross-sectional side view through the A-A' axis of the semiconductor device 100 shown in FIG. 4A.

On one side (first side 440) of the metal gate 330, a first trench 401 is formed over the first nanosheet stack 103a, and a second trench 402 is formed over the second nanosheet stack 103b and third nanosheet stack 103c. The first trench 401 extends through the ILD 332 to the epitaxial growth 210 on the first nanosheet stack 103a. The second trench 402 extends through the ILD 332 to the epitaxial growth 210 on the second nanosheet stack 103b and third nanosheet stack 103c. The second trench 402 is wider than the first trench 401 so that once filled, the second nanosheet stack 103b and third nanosheet stack 103c will be electrically connected (coupled) on the first side 440 of the metal gate 330. The first and second nanosheet stacks 103a and 103b are isolated from one another on the first side 440 of the gate 330.

On the other side (second side 441) of the metal gate 330 (see FIG. 4A), a third trench 403 is formed over the first nanosheet stack 103a and second nanosheet stack 103b, and a fourth trench 404 is formed over the third nanosheet stack 103c. The third trench 403 extends through the ILD 332 to the epitaxial growth 210 on the first nanosheet stack 103a and second nanosheet stack 103b. The fourth trench 404 extends through the ILD 332 to the epitaxial growth 210 on the third nanosheet stack 103c. The third trench 403 is wider than the fourth trench 404 so that once filled, the first nanosheet stack 103a and the second nanosheet stack 103c will be electrically connected (coupled) on the other side (second side 441) of the metal gate 330. The second and third nanosheet stacks 103b and 103c are isolated from one another on the second side 441 of the gate 330.

The trenches (first trench 401, second trench 402, third trench 403, and fourth trench 404) can be formed by removing portions of the ILD 332 by a suitable etch process. According to one or more embodiments, the etch process used to form the trenches is a reactive ion etch (RIE).

Figure 5B:
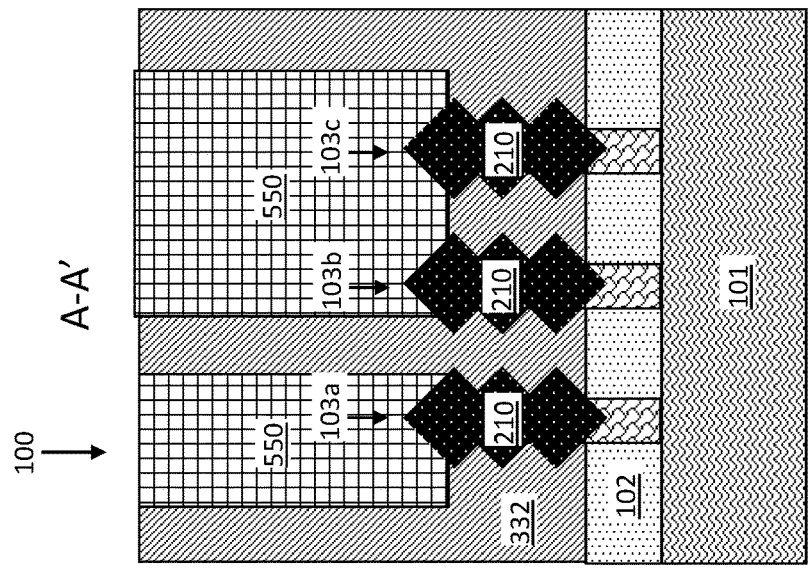
Figure 5A:
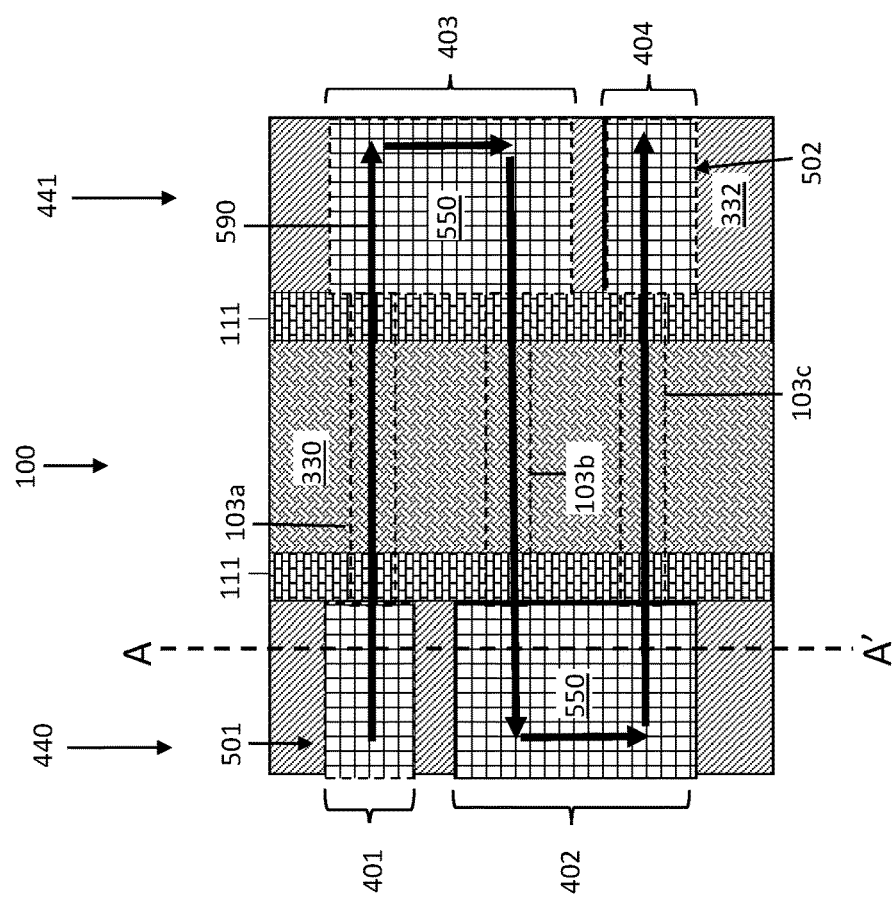
FIG. 5A depicts a top view of a semiconductor device after depositing a metal in the trenches.

FIG. 5A depicts a top view of the semiconductor device 100 after depositing metal 550 in the trenches. FIG. 5B depicts a cross-sectional side view through the A-A' axis of the semiconductor device 100 shown in FIG. 5A.

The metal 550 fills the first trench 401, second trench 402, third trench 403, and fourth trench 404. Using alternating trenches of different widths to connect (couple) a set of nanosheet stacks on the first side 440 of the gate 330 (second nanosheet stack 103b and third nanosheet stack 103c) and then to connect (couple) that pair of nanosheet stacks with another nanosheet stack (second nanosheet stack 103b and third nanosheet stack 103c) on the other side (second side 441) of the gate 330 enables formation of a long serpentine channel 590 that crosses through the metal gate 330 in three areas. The channel 590 connects (couples) the first nanosheet stack 103a, the second nanosheet stack 103b, and the third nanosheet stack 103c. The first nanosheet stack 103a and the second nanosheet stack 103b are connected (coupled) on one side of the gate by a metal-filled trench, and the second nanosheet stack 103b and the third nanosheet stack 103c are connected (coupled) on another side of the gate by a metal-filled trench.

Source/drains 501, 502 are arranged on opposing sides of the gate 330 at the terminal ends of the serpentine channel 590 (see FIGS. 5A and 5C).

The metal 550 can include one or more layers of conductive metal materials that depends on the type of transistor and can provide low contact resistance. According to some embodiments, the metal 550 includes a liner layer and a metal fill. Non-limiting examples of materials for the liner layer include Co, Ti, CoTi, Ni, Pt, NiPt, NiPtTi, Ta, TaNi, TaAl, TaAlN, TiN, TiAl, TiAlN, or any combination thereof. The one or more layers/films making up the liner layer can be formed by a chemical vapor deposition process (CVD), atomic layer deposition (ALD), or other suitable process. The metal fill deposited on the liner layer is a conductive metal, for example, aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, or sputtering. After deposition, a planarization process, for example, chemical mechanical planarization (CMP) is performed to remove any conductive material from the surface of the ILD 332.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a semiconductor device, the method comprising:
    forming a gate on a first nanosheet stack, a second nanosheet stack, and a third nanosheet stack arranged on a substrate;
    depositing a semiconductor material on the first nanosheet stack, the second nanosheet stack, and the third nanosheet stack;
    depositing an interlayer dielectric (ILD) on the first nanosheet stack, the second nanosheet stack, and the third nanosheet stack;
    forming a first trench and a second trench through the ILD on a first side of the gate, and a third trench and a fourth trench through the ILD on a second side of the gate, the second trench coupling the second nanosheet stack to the third nanosheet stack, and the third trench coupling the first nanosheet stack to the second nanosheet stack; and
    depositing a metal in the first trench, the second trench, the third trench, and the fourth trench.

2. The method of claim 1, wherein a pitch between the first nanosheet stack and the second nanosheet stack comprises at least 30 nanometers (nm).

3. The method of claim 1, wherein depositing the semiconductor material comprises applying an epitaxial growth process.

4. The method of claim 1, wherein subsequent to depositing the metal a channel is formed that crosses through the gate in three areas.

5. The method of claim 1, wherein the first trench extends through the ILD to the semiconductor material on the first nanosheet stack.

6. The method of claim 5, wherein the second trench extends through the ILD to the semiconductor material on the second nanosheet stack and the third nanosheet stack.

7. The method of claim 1, wherein the third trench extends through the ILD to the semiconductor material on the first nanosheet stack and the second nanosheet stack, and the fourth trench extends through the ILD to the semiconductor material on the third nanosheet stack.

8. A method for fabricating a semiconductor device, the method comprising:

forming a gate on a first nanosheet stack, a second nanosheet stack, and a third nanosheet stack arranged on a substrate, the first nanosheet stack, the second nanosheet stack, and the third nanosheet stack comprising alternating layers of silicon and silicon germanium;

depositing a semiconductor material on the layer of silicon of the first nanosheet stack, the second nanosheet stack, and the third nanosheet stack;

depositing an interlayer dielectric (ILD) on the first nanosheet stack, the second nanosheet stack, and the third nanosheet stack;

forming a first trench and a second trench through the ILD on a first side of the gate, and a third trench and a fourth trench through the ILD on a second side of the gate, the second trench coupling the second nanosheet stack to the third nanosheet stack, and the third trench coupling the first nanosheet stack to the second nanosheet stack; and depositing a metal in the first trench, the second trench, the third trench, and the fourth trench.

9. The method of claim 8, wherein a pitch of the first nanosheet stack and the second nanosheet comprises at least 30 nanometers (nm).

10. The method of claim 8, wherein depositing the semiconductor material is by an epitaxial growth process.

11. The method of claim 10, wherein the semiconductor material deposited on the first nanosheet stack and the second nanosheet stack does not overlap each another.

12. The method of claim 8, wherein after depositing the metal, a channel is formed that crosses through the gate in three areas.

13. The method of claim 8, wherein the gate comprises a sacrificial gate material.

14. The method of claim 13, wherein the gate is replaced with a metal gate stack before forming the first trench on the first side of the gate and the second trench on the second side of the gate.

* * * * *